United States Patent
Wei et al.

(10) Patent No.: US 7,510,926 B2
(45) Date of Patent: Mar. 31, 2009

(54) TECHNIQUE FOR PROVIDING STRESS SOURCES IN MOS TRANSISTORS IN CLOSE PROXIMITY TO A CHANNEL REGION

(75) Inventors: Andy Wei, Dresden (DE); Thorsten Kammler, Ottendorf-Okrilla (DE); Jan Hoentschel, Dresden (DE); Manfred Horstmann, Duerrrhoehrsdorf-Ditterbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 180 days.

(21) Appl. No.: 11/558,982

(22) Filed: Nov. 13, 2006

(65) Prior Publication Data

US 2007/0228357 A1    Oct. 4, 2007

(30) Foreign Application Priority Data

Mar. 31, 2006    (DE)    ............ 10 2006 015 075

(51) Int. Cl.
    *H01L 21/8238*    (2006.01)
(52) U.S. Cl. .............. 438/221; 438/219; 438/294; 257/220; 257/288

(58) Field of Classification Search .......... 438/219, 438/221, 294, 299; 257/220, 288, 374, 401
See application file for complete search history.

(56) References Cited

U.S. PATENT DOCUMENTS

| | | | |
|---|---|---|---|
| 6,979,622 B1 | 12/2005 | Thean et al. ............. 438/286 |
| 7,338,847 B2 * | 3/2008 | Shaheed et al. ........... 438/199 |
| 7,358,551 B2 * | 4/2008 | Chidambarrao et al. ..... 257/288 |
| 2005/0035369 A1 | 2/2005 | Lin et al. ................ 257/194 |
| 2005/0035470 A1 | 2/2005 | Ko et al. ................ 257/900 |
| 2005/0266631 A1 | 12/2005 | Kim et al. .............. 438/216 |
| 2007/0057324 A1 * | 3/2007 | Tews et al. .............. 257/347 |
| 2007/0200176 A1 * | 8/2007 | Kammler et al. .......... 257/347 |

FOREIGN PATENT DOCUMENTS

DE    10 2004 041 066    3/2005    ......... 29/78

* cited by examiner

*Primary Examiner*—Phuc T Dang
(74) *Attorney, Agent, or Firm*—Williams, Morgan & Amerson, P.C.

(57) ABSTRACT

A strained semiconductor material may be positioned in close proximity to the channel region of a transistor, such as an SOI transistor, while reducing or avoiding undue relaxation effects of metal silicides and extension implantations, thereby providing enhanced efficiency for the strain generation.

9 Claims, 6 Drawing Sheets

TECHNIQUE FOR PROVIDING STRESS SOURCES IN MOS TRANSISTORS IN CLOSE PROXIMITY TO A CHANNEL REGION

BACKGROUND OF THE INVENTION

1. Field of the Invention

Generally, the present invention relates to the formation of integrated circuits, and, more particularly, to the formation of transistors having strained channel regions by using stress sources, such as embedded strained layers, stressed overlayers and the like, to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above-mentioned process adaptations associated with device scaling. One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since for example strained silicon may be considered as a "new" type of semiconductor material, which may enable the fabrication of fast powerful semiconductor devices without requiring expensive semiconductor materials, while many of the well-established manufacturing techniques may still be used.

Therefore, in one approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source extension regions of the PMOS transistors are formed. Thereafter, respective sidewall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, the silicon/germanium layer is selectively formed in the PMOS transistor by epitaxial growth. Typically, the strained silicon/germanium is provided with a certain degree of "overfill" during the epitaxial growth in order to reduce the consumption of "precious" strained silicon/germanium material during a silicidation process for forming a metal silicide in the drain and source regions for obtaining a reduced contact resistance. Although this process technique may provide significant advantages for bulk devices, since, here, the respective cavities for receiving the strained silicon/germanium material may be etched deep into the silicon layer, in SOI, this strategy is less efficient due to the limited thickness of the silicon layer, in particular when highly scaled SOI devices are considered.

In view of the above-described situation, there exists a need for an improved technique that efficiently increases the performance of MOS transistors by strained semiconductor materials, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that provides enhanced transistor performance by significantly increasing the strain in the channel region by more efficiently transferring stress from one or more stress sources into the channel region. For this purpose, a strained semiconductor material, possibly in combination with a stressed dielectric layer, may be positioned more closely to the channel region in order to significantly enhance the stress transfer. For this purpose, the strained semiconductor material may be positioned close to the channel region substantially without any strain relaxed portion at a height level corresponding to the gate insulation layer, thereby enhancing the amount of strain created in the channel region.

According to one illustrative embodiment of the present invention, a semiconductor device comprises a substrate and a semiconductor layer formed above the substrate. The semiconductor device further comprises a gate electrode formed above the semiconductor layer and separated therefrom by a gate insulation layer. A strained semiconductor material is formed in the semiconductor layer, wherein the strained semiconductor material extends above the gate insulation layer. A drain region and a source region are formed partially within the strained semiconductor material and a sidewall spacer is formed at a sidewall of the gate electrode and above the strained semiconductor material. Finally, the semiconductor device further comprises a metal silicide region formed in the drain and source regions adjacent to the sidewall spacer.

According to another illustrative embodiment of the present invention, a method comprises forming a recess adjacent to a gate electrode on the basis of an offset spacer formed at a sidewall of the gate electrode, wherein the gate electrode is formed on a gate insulation layer having a bottom surface. The method further comprises forming a strained semiconductor material in the recess, wherein the strained semiconductor has, at least on a portion thereof, a top surface that extends above the bottom surface of the gate insulation layer by a specified excess height. Moreover, the method comprises forming a drain and source extension region adjacent to the gate electrode by ion implantation, wherein a depth of the drain and source extension region substantially corresponds to the excess height.

BRIEF DESCRIPTION OF THE DRAWINGS

The invention may be understood by reference to the following description taken in conjunction with the accompanying drawings, in which like reference numerals identify like elements, and in which.

Figure 1A:
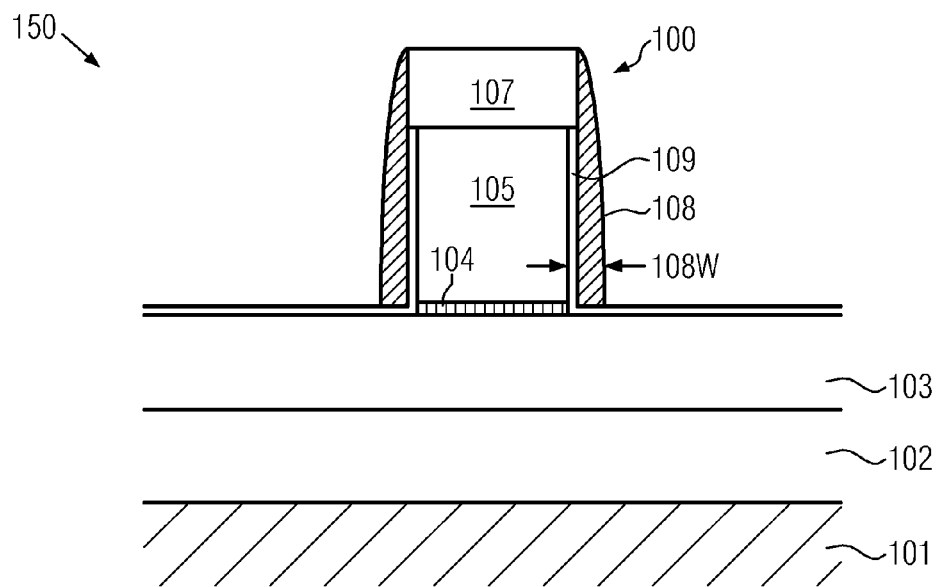
FIGS. 1a-1f schematically illustrate cross-sectional views of a transistor element during the formation of a strained semiconductor material with reduced offset to the gate electrode in order to enhance a stress transfer according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for enhancing the stress transfer into the channel region of respective transistors by positioning the strained semiconductor material in close proximity to the gate electrode, for instance with a distance of several nanometers and significantly less, for example as small as approximately 5 Å, in order to significantly enhance the stress transfer, wherein, in some illustrative embodiments, a negative impact of strain relaxation by the formation of extension regions by ion implantation is taken into consideration so as to substantially position non-relaxed strained semiconductor material in the vicinity of the gate electrode and thus of the channel region. As will be described later on in more detail, this aspect for enhancing the strain may be appropriately combined with the formation a stressed overlayer, wherein a recessed configuration of the deep drain and source regions may be provided to obtain a more direct stress transfer from the stressed overlayer to the channel region. Thus, even for highly scaled SOI-like transistor architectures, an efficient strain-inducing mechanism by an embedded strained layer is provided, even though a stress transfer by the strained semiconductor material is restricted to the available thickness of the corresponding active semiconductor layer, contrary to bulk devices in which strained semiconductor material may be formed down to a significant depth of the drain and source regions.

With reference to FIGS. 1a-1f, further illustrative embodiments of the present invention will be described in more detail, wherein a corresponding strained semiconductor material is positioned extremely closely to the gate electrode with a lateral distance of a few nanometers and even significantly less in order to even further enhance the strain in the adjacent channel region. A corresponding transistor configuration may be highly advantageous in the context of silicon-on-insulator (SOI) transistors, in which a respective cavity for forming the strained semiconductor material may not be etched arbitrarily deeply into the respective semiconductor material due to the restricted thickness of the corresponding active semiconductor layer.

FIG. 1a schematically illustrates a semiconductor device 150 comprising a transistor 100 that is formed above a substrate 101 having formed thereon, in one illustrative embodiment, a buried insulating layer 102. Furthermore, a semiconductor layer 103, such as a silicon-based layer, is formed on the buried insulating layer 102. Furthermore, in this manufacturing stage, the transistor 100 comprises a gate electrode 105 that may be encapsulated by a capping layer 107 and thin sidewall spacers 108 with a respective liner 109 formed between the gate electrode 105 and the spacer 108. A combined width 108W of the liner 109 and the spacer 108 may be selected to define a desired small offset for a region of strained semiconductor material to be formed within the layer 103 adjacent to the gate electrode 105. For instance, the spacer 108 may have a width 108W, including the thickness of the liner 109, of approximately 1-10 nm, depending on the desired offset.

A typical process flow for forming the semiconductor device 150 as shown in FIG. 1a may comprise the following processes. After forming the semiconductor layer 103, for instance by providing an appropriate SOI-like substrate, or by epitaxial growth techniques, when the substrate 101 is a semiconductor bulk substrate without the buried layer 102, respective implantation processes may be performed in order to obtain a desired vertical dopant profile (not shown) within the semiconductor layer 103. Thereafter, a dielectric layer may be formed, for instance by oxidation and/or deposition on the basis of well-established techniques, followed by the deposition of a gate electrode material by well-established deposition techniques, such as low pressure chemical vapor deposition (LPCVD), when, for instance, polysilicon is considered. Furthermore, a respective capping layer may be formed on the gate electrode material. Next, the gate electrode material, the dielectric layer and the capping layer may be patterned on the basis of sophisticated photolithography and etch techniques in order to obtain the gate insulation layer 104 and the gate electrode 105 covered by the capping layer 107. Subsequently, the liner 109 may be formed, for instance by an oxidation process, to provide the required small and well-controllable thickness of the liner 109. Thereafter, a corresponding spacer layer, such as a silicon nitride layer, may be deposited with a required thickness as specified above, for instance with a thickness from approximately 1-10 nm or 2-7 nm, which is then anisotropically etched on the basis of well-established recipes, thereby providing the spacer 108. It should be appreciated that the width 108W of the spacer 108, which substantially determines an offset of a strained semiconductor material with respect to the gate electrode 105, is selected so as to substantially avoid any undue impact on the gate insulation layer 104 after a corresponding cavity etch during a subsequent cleaning process prior to the selective epitaxial growth process. Thus, after the formation of the spacer 108, an anisotropic etch process may be performed to generate a respective recess adjacent to the gate electrode 105 and having a small offset therefrom in order to maintain the integrity of the gate insulation layer 104 during subsequent cleaning processes for preparing the device 150 for the subsequent selective epitaxial growth process. Corresponding anisotropic etch recipes are well-established in the art.

Figure 1B:
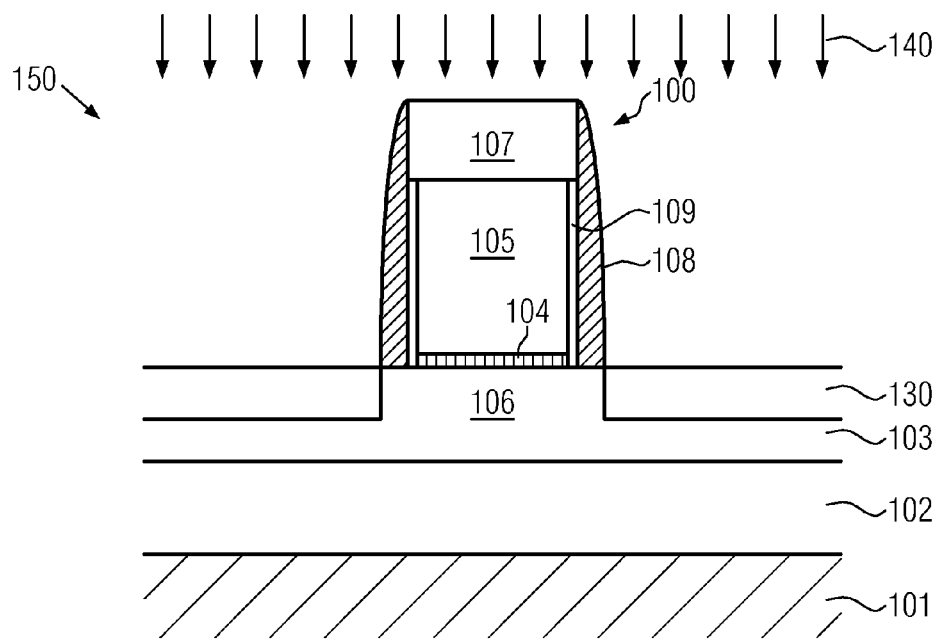

FIG. 1b schematically illustrates the device 150 during a selective epitaxial growth process 140 for forming a strained semiconductor material 130 in a recess obtained by the preceding anisotropic etch process. In one illustrative embodiment, the strained semiconductor material 130 comprises silicon and germanium, when the transistor 100 represents a P-channel transistor, in order to provide compressive strain in the channel region 106. In one illustrative embodiment, contrary to conventional selective epitaxial growth processes for forming embedded silicon/germanium, a substantially intrinsic silicon/germanium material, i.e., a non-doped silicon/germanium material, is deposited, thereby significantly enhancing the controllability of the selective growth process compared to a corresponding process, in which a P-type dopant material is included in the deposition atmosphere in order to provide the strained silicon/germanium material as a highly doped semiconductor material. Consequently, the process 140 may be efficiently controlled to provide the material 130 with a desired thickness when a certain degree of overfill is desired.

Figure 1C:
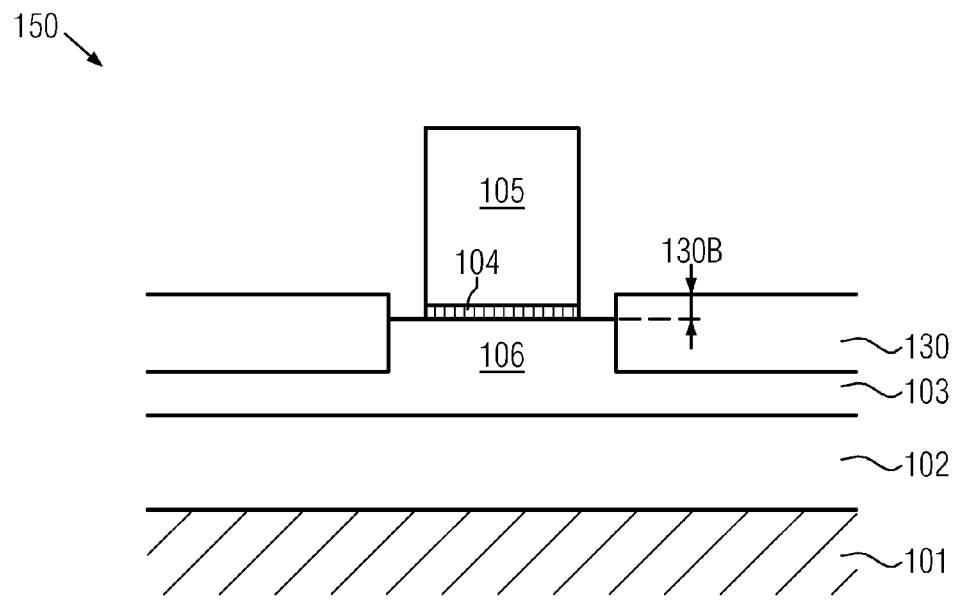

FIG. 1c schematically illustrates the semiconductor device 150 after the completion of the epitaxial growth process 140 and after the removal of the sidewall spacer 108 and the capping layer 107. Moreover, as illustrated, a certain degree of overfill or excess height indicated as 130B is provided for the strained semiconductor material 130, which may be accomplished with high controllability even for silicon/germanium, when the silicon/germanium is provided as a substantially intrinsic semiconductor material. The magnitude of the overfill 130B may be selected in accordance with device requirements and may, in illustrative embodiments, be selected so as to substantially correspond to an averaged implantation depth of a dopant species to define extension regions adjacent to the gate electrode 105.

Thereafter, the further processing may be continued by forming respective drain and source extension regions and deep drain and source regions on the basis of an appropriately dimensioned spacer structure.

Figure 1D:
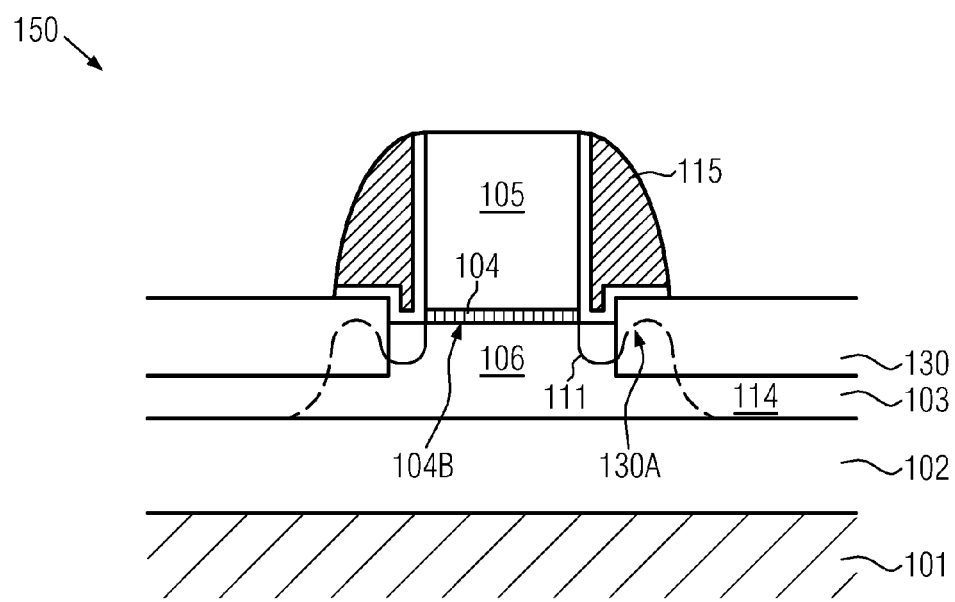

FIG. 1d schematically depicts the device 150 with source and drain extension regions 111 and deep drain and source regions 114. Moreover, a sidewall spacer structure 115 is formed at the sidewalls of the gate electrode 105. It should be appreciated that the spacer structure 115 may comprise a plurality of individual spacer elements, depending on the complexity of the dopant profile of the extension regions 111 and the drain and source regions 114. The extension region 111 and the drain and source regions 114 may be formed by ion implantation on the basis of appropriately selected implantation parameters, wherein, in some illustrative embodiments, during the formation of the extension regions 111, the implantation energy is adjusted to define the averaged penetration depth at a value that substantially corresponds to the excess height 130B. Consequently, implantation-induced damage in the strained semiconductor material 130 is reduced at a height level that substantially corresponds to the level of the bottom surface 104B of the gate insulation layer 104, thereby also reducing any strain relaxing effects that may otherwise be caused.

Figure 1E:
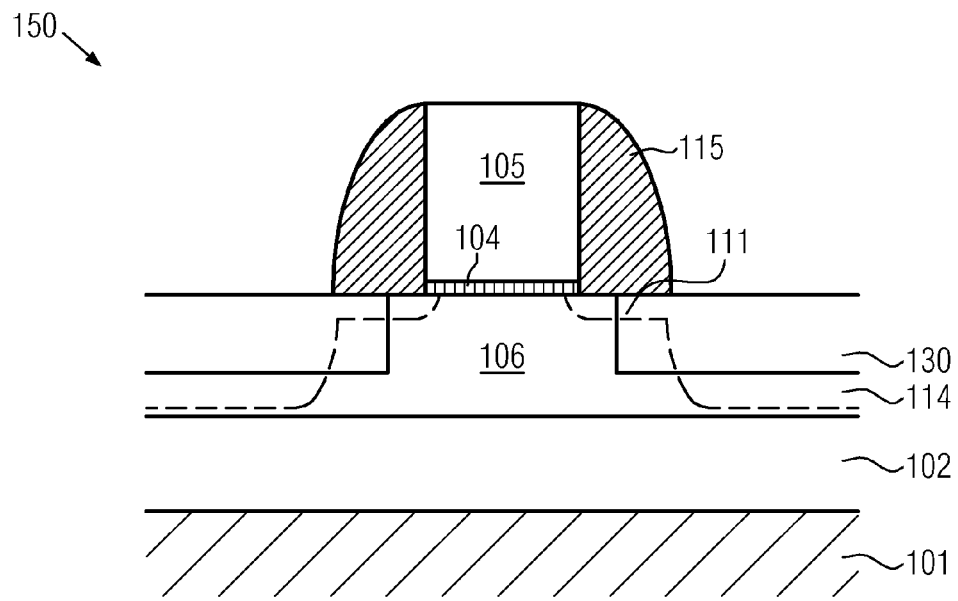

FIG. 1e schematically illustrates a situation for a substantially flush strained semi-conductor material 130 in which may be formed the drain and source region 114 and the extension region 111 on the basis of a corresponding spacer structure 115. As is evident, for such a configuration, the extension region 111 is formed in the upper portion of the strained semiconductor material 130, thereby resulting in a certain amount of relaxation of this material due to implantation-induced damage. Consequently, the semiconductor material within the extension region 111 at the height level corresponding to the bottom surface 104B may not be as highly strained as without a corresponding implantation penetrating into this area, thereby reducing the efficiency of strain generation in the adjacent channel region 106. Thus, the overfill or excess height 130B (FIG. 1c) may be selected such that it substantially corresponds to the average penetration depth defined by the extension region 111 in a correspondingly designed implantation sequence so that, after performing the implantation, an upper portion of the material 130 may be damaged, that is, doped, in a similar fashion as shown in FIG. 1d, wherein, however, the damaged and thus partially relaxed semiconductor material is positioned at a height level above that of the channel region 106, where a strain transfer is less effective. For example, the overfill 130B may be provided in a range of approximately 5-7 nm for a typical transistor configuration involving a gate length of significantly less than 100 nm. It should be appreciated, however, that the degree of overfill 130B may be readily adapted to any other device configuration. It should be appreciated that, in some embodiments, the strained semiconductor material 130 comprises a substantially non-doped silicon/germanium mixture and therefore, due to the missing dopant precursors, an enhanced process control during the selective epitaxial growth may be achieved.

Figure 1F:
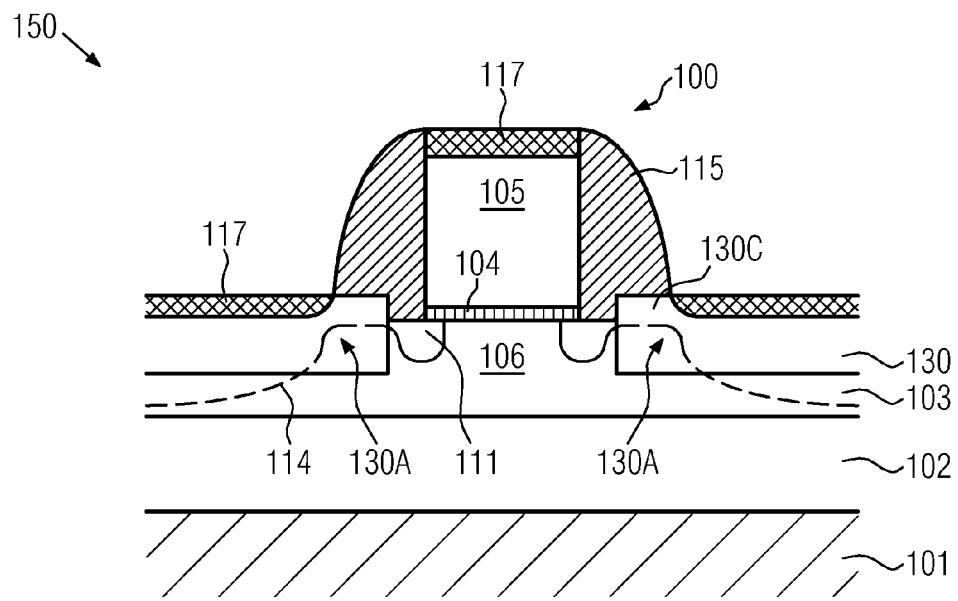

FIG. 1f schematically illustrates the device 150 in a further advanced manufacturing stage, in which metal silicide regions 117 are formed in the drain and source regions 114 and the gate electrode 105 of the transistor 100 on the basis of the spacer structure 115. That is, the significant portion 130A of substantially non-relaxed semiconductor material is provided at a height level corresponding to the channel region 106 due to the provision of the overfill 130B. Moreover, since the strained portion 130A is located next to the gate electrode 105 and thus to the channel region 106 with only a minor offset, which may be a few nanometers and significantly less, for example as low as approximately 5 Å, a highly efficient strain generating mechanism is provided. Moreover, the metal silicide regions 117 in the drain and source regions 114 are also offset from a raised portion 130C of the strained material 130. Hence, precious highly strained material 130 is not consumed, since the metal silicide regions 117 are formed with an offset, thereby additionally providing increased process flexibility, since the depth of the metal silicide regions 117 may be selected greater than the excess height 130B, substantially without negatively affecting the strain in the channel region 106. Even a recessed transistor configuration may be used for the deep drain and source regions 114, as will be described later on in more detail.

Moreover, the further processing may be continued by the formation of an appropriate etch stop layer, which may also have a high intrinsic stress so as to even further enhance the strain created in the channel region 106. It should be appreciated that the above-described process sequence is highly advantageous in combination with SOI devices, since here the restricted thickness of the semiconductor layer 103 compared to bulk devices may be efficiently compensated for by appropriately positioning the non-relaxed portion 130A in close proximity to the channel region 106. In other cases, the process technique described with reference to FIGS. 1a-1f may also be used in combination with bulk devices in order to enhance even more the strain-inducing mechanism thereof. Furthermore, the above-described sequence may be highly advantageously used in combination with P-type transistors, in which intrinsic silicon/germanium material may be deposited as the material 130, thereby providing high controllability of the selective epitaxial growth process. In other embodiments, other materials may be used that may enhance the efficiency of strain generation, such as materials of higher covalent radius compared to germanium, or, in other cases, silicon/carbon may be used in order to provide enhanced tensile strain in the respective channel region 106 when an N-channel transistor is considered. In still other illustrative embodiments, the technique described with reference to FIGS. 1a-1f may be advantageously combined with a recessed transistor architecture, wherein, for instance, after the formation of the spacer structure 115 and after or before the formation of the drain and source regions 114, a corresponding etch process may be carried out in order to form a respective recess. In such a configuration, the corresponding implant parameters may be appropriately re-designed to take into consideration the corresponding recess. After recessing the drain and source regions 114, a corresponding stressed contact etch stop layer may be formed to extend into the recess, thereby also significantly enhancing the stress transfer mechanism, as will also be described in the following.

Figure 2A:
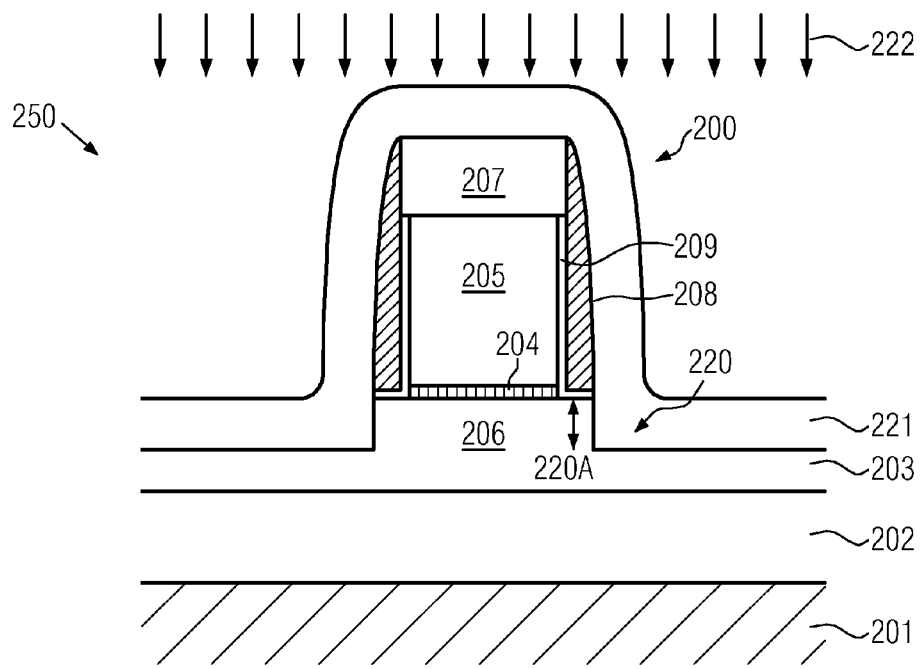
FIGS. 2a-2e schematically illustrate cross-sectional views of a transistor element during the formation of a strained semiconductor material with reduced offset to the gate electrode and recessed drain and source regions for receiving a stressed contact etch stop layer according to further illustrative embodiments of the present invention.

FIG. 2a schematically depicts a semiconductor device 250 comprising a transistor 200 having at this manufacturing stage a similar configuration as the device 150 in FIG. 1b. Thus, the transistor 200 may be formed above a substrate 201 comprising a buried insulating layer 202. Furthermore, a semiconductor layer 203 is formed on the buried insulating layer 202, above which is formed a gate electrode 205 that may be encapsulated by a capping layer 207 and thin sidewall spacers 208 with a respective liner 209 formed between the gate electrode 205 and the spacer 208. With respect to the combined width 208W of the liner 209 and the spacer 208, the same criteria apply as previously explained with reference to the width 108W. Additionally, a recess 220 having a first depth 220A is formed in the semiconductor layer 203 adjacent to the spacer 208. Furthermore, the transistor 200 is covered by a spacer layer 221, which may be comprised of silicon dioxide and the like.

The device as shown in FIG. 2a may be formed on the basis of the same processes as previously described with reference to the device 150. In addition, after etching the recess 220 up to the first depth 220A, the spacer layer 221 may be deposited on the basis of well-established chemical vapor deposition (CVD) techniques. Next, an anisotropic etch process 222 may be performed to obtain an additional offset spacer adjacent to the spacer 208 to be used in a further cavity etch process.

Figure 2B:
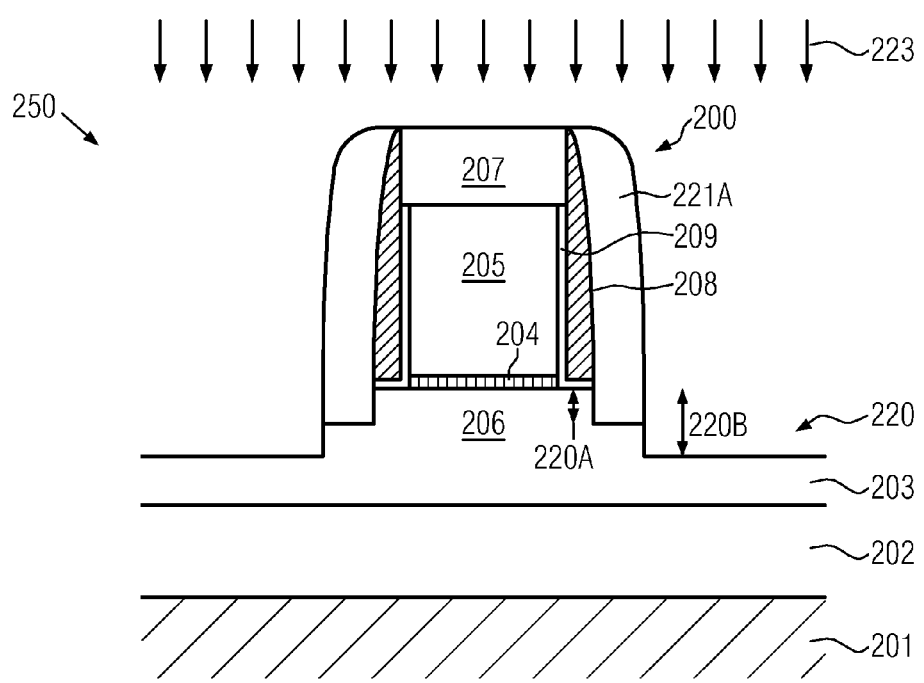

FIG. 2b illustrates the device 250 during a corresponding cavity etch 223 on the basis of spacers 221A so as to obtain a second depth 220B within the recess 220. Thereafter, the spacers 221A may be selectively removed on the basis of well-established recipes. It should be noted that the spacers 221A may also be removed from other transistors, such as N-channel transistors, which may still be covered by a silicon nitride layer, from which the spacers 208 may have been formed.

Figure 2C:
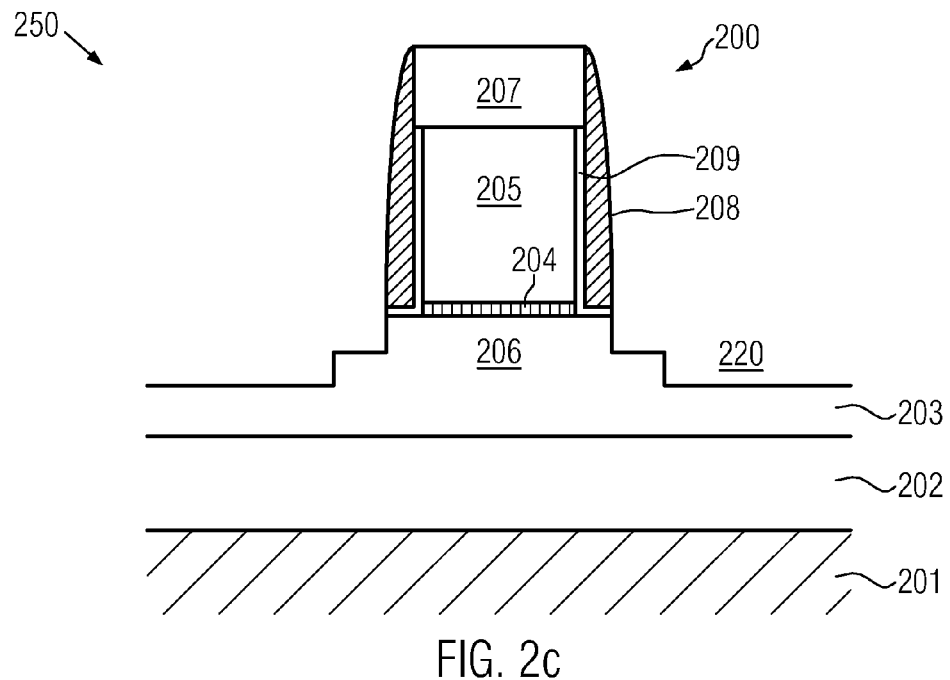

FIG. 2c schematically depicts the device 250 after the removal of the spacers 221A, thereby exposing the recess 220 having the first and second depths 220A, 220B.

Figure 2D:
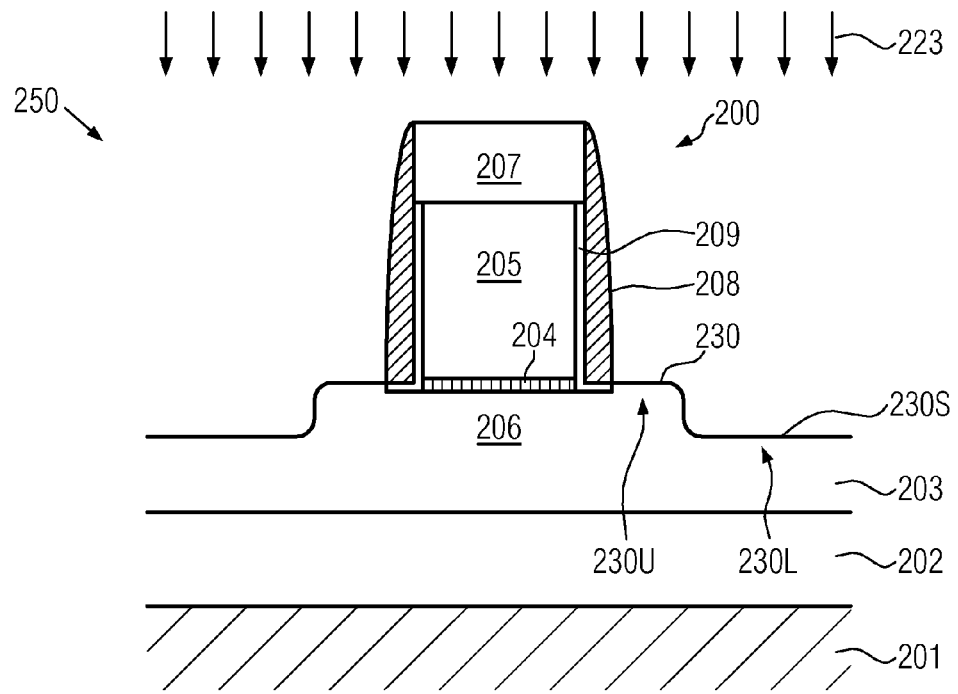

FIG. 2d schematically illustrates the device 250 during a selective epitaxial growth process 240 for forming a strained semiconductor material 230 in the recess 220. In some illustrative embodiments, the first depth 220A is selected to provide a desired strain in the channel region 206, as is described above, while the second depth may selected to result in a recessed configuration, although a raised strained portion 230U is provided, wherein the respective excess height of the portion 230U with respect to a bottom surface 204B of the gate insulation layer 204 may be selected as is previously explained for the height 130B. Hence, the strained material 230 comprises a recessed portion 230L, the top surface 230S of which is below a height level of the bottom surface 204B of the gate insulation layer 204. With respect to the growth process 240 and the material 230, the same criteria apply as previously explained. Then, the processing may be continued on the basis of the process techniques previously described.

Figure 2E:
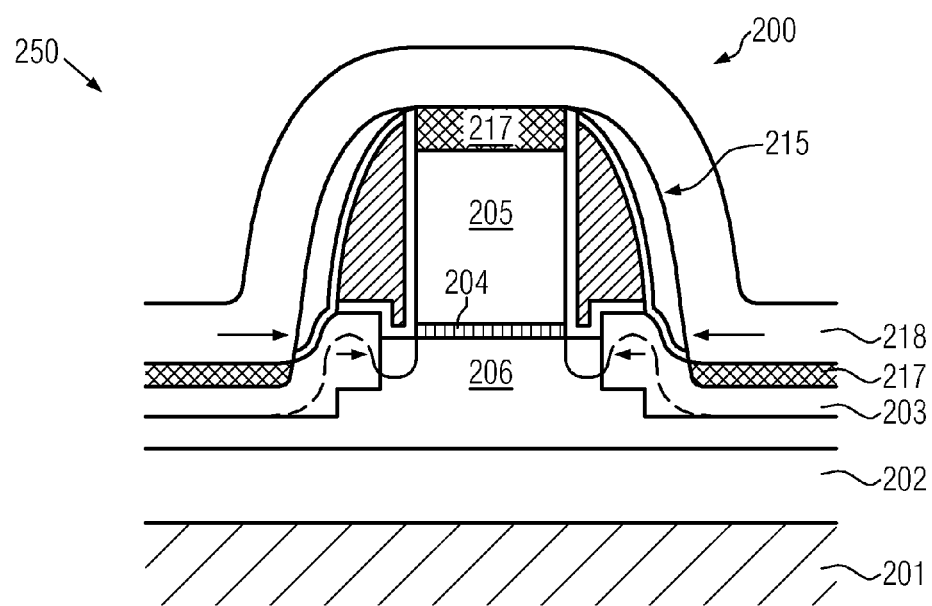

FIG. 2e schematically shows the device 250 in a further advanced manufacturing stage. Here, the transistor 200 may comprise respective drain and source regions 214 and extension regions 211, wherein a substantially non-relaxed strained material is formed adjacent to the channel region 206 due to the raised configuration of the strained material 230, as is previously explained. Furthermore, a corresponding spacer structure 215 may be provided, which may substantially determine the lateral offset of the drain and source regions 214 and of metal silicide regions 217, wherein, as shown, two or more individual spacer elements may be provided. In addition, a stressed contact etch stop layer 218 may be formed above the transistor 200 and within the recessed configuration provided by the material 230. Consequently, stress 218A of the stressed layer 218 may act with increased efficiency due to an increased direct or lateral stress component. Hence, the overall strain in the channel region 206 may be increased in a highly efficient manner due to the reduced offset of the strained material 230 from the channel region 206 in combination with the raised portion 230U, providing for a reduced relaxation at the height level of the gate insulation layer 204, and in combination with the increased efficiency of the layer 218.

As a result, the present invention provides an enhanced technique for the manufacturing of transistor elements having formed therein one or more strain-inducing sources, the efficiency of which is significantly increased by positioning the respective strain-inducing source more closely to the channel region of the respective transistor element. In some aspects, strained semiconductor material may be positioned more closely to the channel region, wherein deleterious strain relaxing effects from metal silicides and implantations for defining extension regions may be reduced or substantially avoided. Consequently, increased efficiency in providing strain in the channel region may be achieved. Furthermore, the technique may be advantageously combined with a recessed drain and source configuration in combination with stressed contact etch stop layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a recess adjacent to a gate electrode on the basis of an offset spacer formed at a sidewall of said gate electrode, said gate electrode formed on a gate insulation layer having a bottom surface;
   forming a strained semiconductor material in said recess, said strained semiconductor material having, at least on a portion thereof, a top surface that extends above said bottom surface of the gate insulation layer by a specified excess height; and
   forming a drain and source extension region adjacent to said gate electrode by ion implantation, a depth of said drain and source extension region in said strained semiconductor material substantially corresponding to said excess height.

2. The method of claim 1, wherein forming said drain and source extension region comprises removing said offset spacer and forming a first sidewall spacer to adjust a lateral offset of said drain and source extension region during said ion implantation process.

3. The method of claim 2, wherein forming said strained semiconductor material comprises forming a substantially non-doped silicon|germanium material by a selective epitaxial growth process.

4. The method of claim 1, wherein said offset spacer has a width of approximately 1 nm or less.

5. The method of claim 1, wherein said excess height is in the range of approximately 3-8 nm.

6. The method of claim 1, wherein forming said recess comprises performing a first etch step on the basis of said offset spacer to a first depth, forming a second offset spacer on said offset spacer and performing a second etch step to obtain a second depth in an exposed portion of said recess.

7. The method of claim 6, wherein said strained semiconductor material is formed with a reduced height with respect to said bottom surface of said gate insulation layer at a recessed region corresponding to said second depth.

8. The method of claim 7, further comprising forming a drain and source region in said recessed region and forming a metal silicide region in said drain and source region.

9. The method of claim 8, further comprising forming a stressed dielectric layer above said recessed region.

* * * * *